United States Patent
Ito et al.

(10) Patent No.: US 7,248,526 B2
(45) Date of Patent: Jul. 24, 2007

(54) REFRESH PERIOD GENERATING CIRCUIT

(75) Inventors: Yutaka Ito, Tokyo (JP); Nobuhiro Odaira, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/180,552

(22) Filed: Jul. 14, 2005

(65) Prior Publication Data

US 2006/0023545 A1    Feb. 2, 2006

(30) Foreign Application Priority Data

Jul. 16, 2004    (JP)    ............................. 2004-210871

(51) Int. Cl.
*G11C 7/00*    (2006.01)
(52) U.S. Cl. ........................ 365/222; 365/211; 365/233
(58) Field of Classification Search ................ 365/211, 365/222, 233
See application file for complete search history.

(56) References Cited

U.S. PATENT DOCUMENTS 5,752,011 A * 5/1998 Thomas et al. ............. 713/501

2005/0146964 A1* 7/2005 Sako .......................... 365/211

FOREIGN PATENT DOCUMENTS

| JP | 05-307882 | 11/1993 |
| JP | 2002-215258 A | 7/2002 |

* cited by examiner

*Primary Examiner*—Hoai V. Ho
(74) *Attorney, Agent, or Firm*—McDermott Will & Emery LLP

(57) ABSTRACT

A refresh period generating circuit which generates a refresh period in refreshing a DRAM cell, comprising: an oscillation circuit which oscillates at a frequency with temperature dependence on ambient temperature; a dividing circuit which divides an oscillation output of the oscillation circuit; a temperature detector which detects the ambient temperature; and a selector which switches and selects among division outputs with respective frequencies from the dividing circuit based on an output of the temperature detector, and outputs a signal as a reference of the refresh period. The temperature dependence in the oscillation circuit includes a positive temperature coefficient in a predetermined temperature range, and does not include a positive temperature coefficient out of the predetermined temperature range. The selector switches the division outputs out of the predetermined temperature range.

4 Claims, 12 Drawing Sheets

PRIOR ART

PRIOR ART

PRIOR ART

REFRESH PERIOD GENERATING CIRCUIT

BACKGROUND OF THE INVENTION

1. Field of the Invention

The present invention relates to a refresh period generating circuit for generating a refresh period in a DRAM product (for example, including general-purpose DRAM, SDRAM, pseudo SRAM, and system LSI installed with DRAM) having the auto refresh function on a memory cell (hereinafter, referred to as a DRAM cell) of DRAM (Dynamic Random Access Memory).

2. Related Art

A DRAM cell is comprised of a capacitor that stores an electrical charge as data and a transistor that switches between input and output of the data. The data retention characteristics of the DRAM cell have extremely large temperature dependence as compared with electrical characteristics of other structural elements such as, for example, a MOS transistor. The electrical characteristics of other structural elements are generally dependent on the temperature dependence of the mobility of electrons. It is known that an increase in temperature by 10° C. makes delay of about 5% in characteristics. Meanwhile, the data retention characteristics of the DRAM cell are principally dependent on junction leakage between a N-type diffusion layer and P-type diffusion layer constituting part of the DRAM cell. It is known that the data retention characteristics (data retention time) become about half as the temperature increases by 10° C.

In recent years, it has become general that widespread portable devices are miniaturized and configured to enable backup by battery. Therefore, the portable devices facilitate their portability. With respect to DRAM products for use in such a type of portable device, self refresh to automatically perform refresh is introduced, and the load on the system can thereby be reduced. As a configuration to perform self refresh, a refresh timer is provided for the DRAM product to perform periodic refresh, an address (word-line address) and clock for refresh is internally generated at the designated time, and refresh is performed automatically.

Particularly at the self refresh time, the portable device usually does not operate, thereby does not exhibit heating, and in consideration of carrying the device, it is assumed that the actual use temperature or the ambient temperature is about room temperature. Therefore, since the data retention time is long at room temperature (at low temperatures), the self refresh period is made longer than that at high temperatures, and thus, the device is provided with the temperature compensation function for refresh to reduce power consumption due to refresh operation.

As the temperature compensation function for refresh, various methods are described in JP 2002-215258 (however, this document discloses compensation examples to eliminate the temperature dependence). FIG. 9 shows a configuration example of a conventional analog-system refresh period generating circuit as an oscillation circuit for varying the oscillation period in analog form by high magnification corresponding to temperature. The configuration of FIG. 9 is suitable for, particularly, temperature compensation for the refresh period with the large temperature dependence. A refresh period generating circuit 100 as shown in FIG. 9 is provided with a band-gap type reference voltage generating circuit (VREF0) 011, a comparative voltage generating circuit (VREF1) 012, a current control signal generating circuit (CSGEN) 013 with positive temperature dependence, and a ring oscillator (R-OSC) 014 as an oscillator.

In the aforementioned configuration, the band-gap type reference voltage generating circuit 011 outputs voltage VBGR with no temperature dependence and voltage VBE with temperature dependence. The comparative voltage generating circuit 012 receives as its input the voltage VBGR with no temperature dependence, and based on the voltage VBGR, generates comparative voltage VRTR0 with no temperature dependence suitable for comparison. The current control signal generating circuit 013 receives the voltage VBE and comparative voltage VRTR0 to compare, generates current control signals OSCBP and OSCBN, and inputs both the signals to the ring oscillator 014. The ring oscillator 014 is configured to control the oscillating frequency using the current control signals OSCBP and OSCBN and output a refresh reference signal REFRQ. The signal REFRQ works as a control signal for refresh.

In addition, assuming that the refresh period is Tref, a minimum cycle allowing refresh is Trcyc, a current flowing when refresh is continued successively at the minimum cycle is Iref, and a standby current is Istb, a current Iself at the self refresh time is expressed as follows:

$$Iself = (Iref) \times (Trcyc/Tref) + Istb$$

Thus, the level is of the order of 250 μA in terms of the capability of the DRAM product. It is necessary to limit the standby current Istb to substantially 20 to 25 μA, and power consumption in refresh period generating circuit 100 is thereby restricted.

FIG. 10 is a graph illustrating the relationship between temperature and refresh period in the analog-system refresh period generating circuit 100 as shown in FIG. 9. In the graph of FIG. 10, the horizontal axis represents temperature, while the vertical axis represents normalized period. In the graph of FIG. 10, a line 021 shows the temperature dependence of the data retention characteristics (refresh period required for data retention) in a typical DRAM cell, while a curve 022 shows the temperature dependence of the refresh period in the refresh period generating circuit 100 as shown in FIG. 9. As can be seen from the curve 022, the temperature dependence decreases and becomes saturated at high temperatures and low temperatures. This is because the control current (described later) in the ring oscillator 014 becomes a constant value and does not vary at upper limit or lower limit. To vary the refresh period in analog form, it is possible to set the temperature such that the temperature dependence becomes saturated at high temperatures or low temperatures at an arbitrary temperature to some extent by design.

However, in the configuration of the analog-system refresh period generating circuit 100, since the oscillating frequency is varied by only a few times at the maximum, the—temperature range that can be covered is narrowed. In other words, in the case of considering 0.5 times/10° C. as the temperature dependence of the data retention time of the DRAM cell, the temperature range that can be covered is only from 20° C. to 30° C., and it is difficult to sufficiently reduce the current consumption at low temperatures. Moreover, to further reduce AC operation part (dynamic current) of current consumption at low temperatures in half, it is required to further reduce a variation range of the oscillating frequency to lower frequencies particularly at low temperatures, but such reduction is difficult. Thus, the conventional analog-system refresh period generating circuit 100 has problems in terms of power reduction of the DRAM product for use in the portable device.

Meanwhile, instead of varying the refresh period in analog form as described above, a configuration is known that varies the refresh period in digital form. An example of the digital-system refresh period generating circuit with such a configuration is disclosed in JP H05-307882.

FIG. 11 shows a configuration example of a conventional digital-system refresh period generating circuit as an oscillation circuit that varies the oscillation period in digital form corresponding to temperature. A refresh period generating circuit 200 as shown in FIG. 11 is comprised of a ring oscillator (R-OSC) 014, a dividing circuit (DIVIDER) 015, a temperature sensor (TEMP-SENSOR) 016 and a frequency selector (SELECTOR) 017.

In the aforementioned configuration, an oscillation output of the ring oscillator 014 is input to the dividing circuit 015, and the frequency selector 017 selects among divided frequencies (division outputs) using a signal to identify the temperature obtained in the temperature sensor 016, and outputs a refresh reference signal REFRQ.

For example, such a constitution is considered that the dividing circuit 015 is a binary counter, and temperature detection is carried out in steps of 10° C., the most significant bit of the binary counter is selected at the minimum detection temperature, and then, lower bit of the binary counter is selected sequentially whenever the temperature increases by one step. Such a constitution reduces the refresh period in half whenever the temperature increases by 10° C., corresponds to that the data retention time of the DRAM cell is reduced in half with a 10° C. increase in temperature as described previously, and thus is convenient. However, to vary in what temperature step is dependent on the performance the temperature selector and a processing method of the divided signal, and is selected by design.

FIG. 12 is a graph illustrating the relationship between temperature and refresh in the digital-system refresh period generating circuit 200 as shown in FIG. 11. In the graph of FIG. 12, the horizontal axis represents temperature, while the vertical axis represents normalized period. In the graph of FIG. 12, a line 021 shows the temperature dependence of the data retention characteristics in a typical DRAM cell, while a solid line 023 shows the temperature dependence of the refresh period in the refresh period generating circuit 200 as shown in FIG. 11. Assuming that the refresh period is designed to vary by one-fourth times every 20° C., since the frequency is the reciprocal of the period, the refresh frequency varies by four times every 20° C. Further, a broken line 024 shows a range of fluctuations of the oscillating frequency or period due to fluctuations of accuracy in frequency switching in the temperature sensor 016, fluctuations in manufacturing process and the like.

It is generally known that in an integrated circuit a relative value is obtained with relatively high accuracy, but an absolute value greatly varies depending on manufacturing conditions. For example, detecting the temperature in steps of 10° C. or making the frequency two times or half is of relative value, and can be implemented with high accuracy. In contrast thereto, for example, detecting 70° C. or outputting a frequency of 100 kHz is of absolute value, and may cause fluctuations of 20% to 30%. In particular, since the idea of varying the refresh period originates from reduction in current consumption when the temperature is low, it is useless trading off an increase in current consumption for suppression of fluctuations.

In other words, a region indicated by the broken line 024 in FIG. 12 represents a range of variations in the characteristics due to process fluctuations, and is close to the limit of data retention characteristics of the line 021 at a switching portion of the refresh period, i.e. a corner portion of the stepwise waveform of the line 023. Accordingly, when effects are considered such as variations in design value, manufacturing parameter and the like, the possibility is assumed that the refresh period is increased exceeding the limit of the data retention characteristics, and data of the DRAM cell is lost. In order to deal with such a phenomenon, it is necessary to secure a wide operation margin in refresh. Such a margin increases the number of refresh times, and current consumption increases.

As described above, in the conventional refresh period generating circuits, when decreasing the frequency of refresh to reduce power consumption, particularly power consumption at low temperatures in self refresh of the DRAM product, there have been defects that a variation amount of the frequency is small in the analog system that provides the frequency with temperature dependence, and that the digital system that provides a large variation in frequency with temperature causes the possibility that the refresh period exceeds a required value at a corner portion of the frequency switching or the like, and to prevent such a possibility, requires a wide operation margin.

SUMMARY OF THE INVENTION

It is an object of the present invention to provide a refresh period generating circuit which oscillates at a frequency with positive temperature dependence (such that the frequency increases at high temperatures), divides the oscillating frequency at a region of high temperatures or at a region of low temperatures where the temperature dependence becomes saturated, selects a divided frequency based on the detected temperature, and thereby is capable of generating a refresh period varying in a wide temperature range, particularly while eliminating the need of a wider operation margin expected from the capability of refresh at high temperatures and reducing current consumption at low temperatures.

A refresh period generating circuit according to an aspect of the present invention which generates a refresh period in refreshing a DRAM cell, comprising: an oscillation circuit which oscillates at a frequency with temperature dependence on ambient temperature; a dividing circuit which divides an oscillation output of said oscillation circuit; a temperature detector which detects said ambient temperature; and a selector which switches and selects among a plurality of division outputs with respective frequencies from said dividing circuit based on an output of said temperature detector, and outputs a signal as a reference of said refresh period, wherein said temperature dependence in said oscillation circuit includes a positive temperature coefficient in a predetermined temperature range, and does not include a positive temperature coefficient out of said predetermined temperature range, and wherein said selector switches said division outputs out of said predetermined temperature range.

According to the aspect of the present invention, since an oscillation circuit with positive temperature dependence is used, a step portion of the stepwise waveform of the refresh period appearing in the conventional digital system becomes oblique close to the data retention characteristics of the DRAM cell, and it is thus possible to decrease a width of the operation margin to set, and to increase the refresh period at low temperatures to realize low power consumption.

In the refresh period generating circuit according to the present invention it is possible that in said selector, a temperature to switch said division outputs at high temperatures out of said predetermined temperature range is set at a temperature out of a range of reliable operation temperature of said semiconductor device.

In the refresh period generating circuit according to the present invention it is possible that said selector does not switch said division outputs at high temperatures out of said predetermined temperature range.

In the refresh period generating circuit according to the present invention it is possible that in switching said division outputs at low temperatures out of said predetermined temperature range, said selector switches to an output providing less power consumption than power consumption in said oscillation circuit in a region with said positive temperature coefficient.

In the refresh period generating circuit according to the present invention, further comprising a second oscillation circuit which oscillates at a longer oscillation period than said oscillation circuit, it is possible that switching said division outputs at low temperatures out of said predetermined temperature range is performed by switching said oscillation circuit to said second oscillation circuit.

In the refresh period generating circuit according to the present invention it is possible that a region of high temperatures out of said predetermined temperature range is regarded as an oscillation range of 77% or more of a maximum oscillating frequency, and a region of low temperatures out of said predetermined temperature range is regarded as an oscillation range of 130% or less of a minimum oscillating frequency.

As described above, according to the invention, the oscillation circuit that determines a refresh period of the DRAM cell is configured with an analog-system oscillation circuit with positive temperature dependence (such that the oscillating frequency increases at high temperatures), and using the fact that a point where the temperature dependence of oscillation disappears exists at high temperature and low temperatures, the oscillating frequency is varied in digital form from such a point where the temperature variation substantially disappears. Accordingly, it is possible to adjust the refresh period over a wider temperature range in accordance with the temperature variation of the DATA retention characteristics of the DRAM cell, and to obtain low current consumption with more efficiency. Further, particularly at high temperatures, the need is eliminated of a wide margin for reliable operation against manufacturing fluctuations occurring at corner portions of frequency switching, and it is thereby possible to realize both efficient refresh and reduction in current consumption.

DETAILED DESCRIPTION OF THE INVENTION

Figure 1:
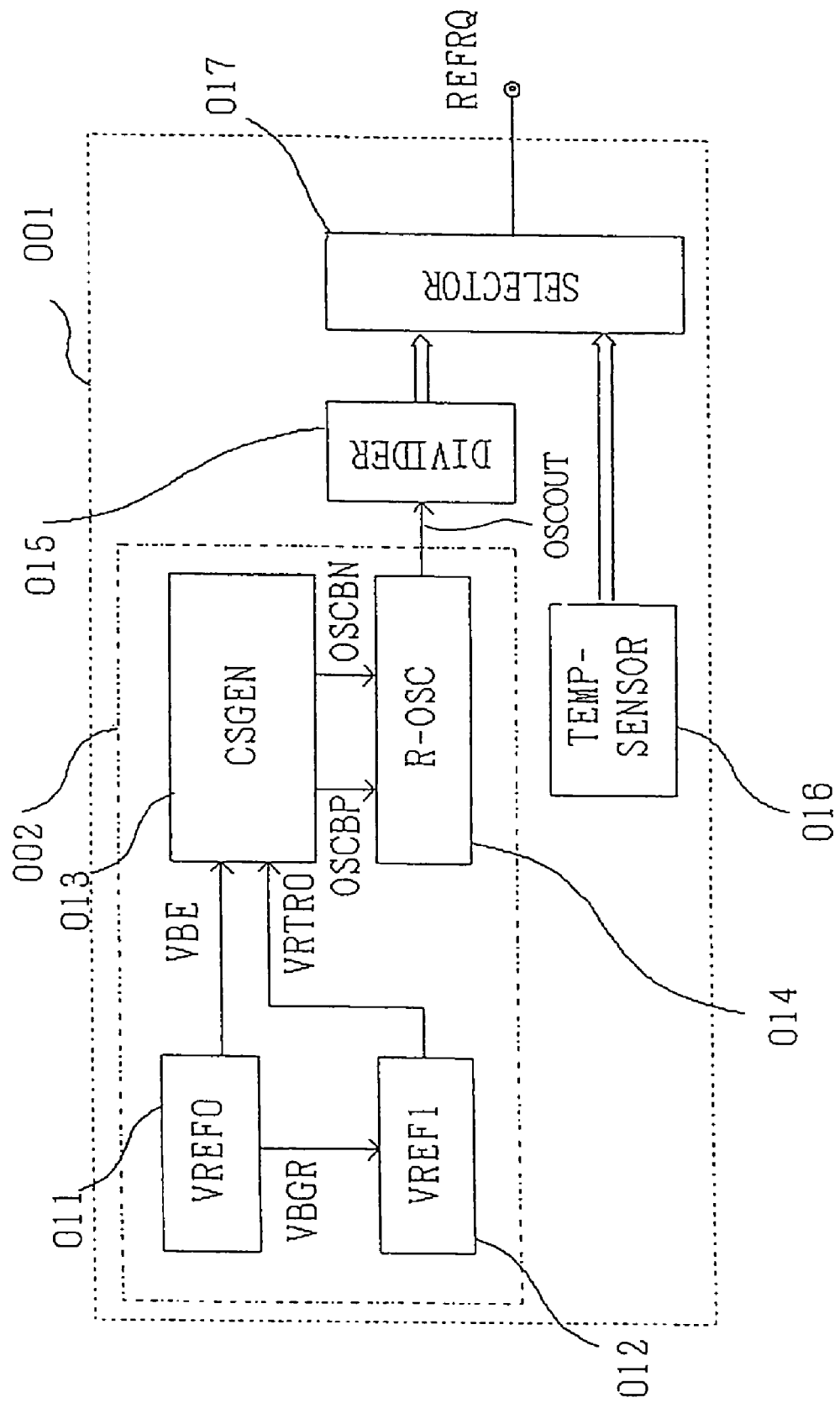
FIG. 1 is a block diagram illustrating a configuration of a refresh period generating circuit of this embodiment.

A preferred embodiment of the invention will specifically be described below with reference to accompanying drawings. FIG. 1 illustrates a configuration of a refresh period generating circuit of this embodiment. A refresh period generating circuit 001 as shown in FIG. 1 is provided with an oscillation circuit 002 such that the oscillating frequency has analog-form temperature dependence, a dividing circuit (DIVIDER) 015, a temperature sensor (TEMP-SENSOR) 016 and a frequency selector (SELECTOR) 017. The refresh period generating circuit 001 outputs a refresh reference signal REFRQ that is a reference of refresh of the DRAM cell.

Figure 9:
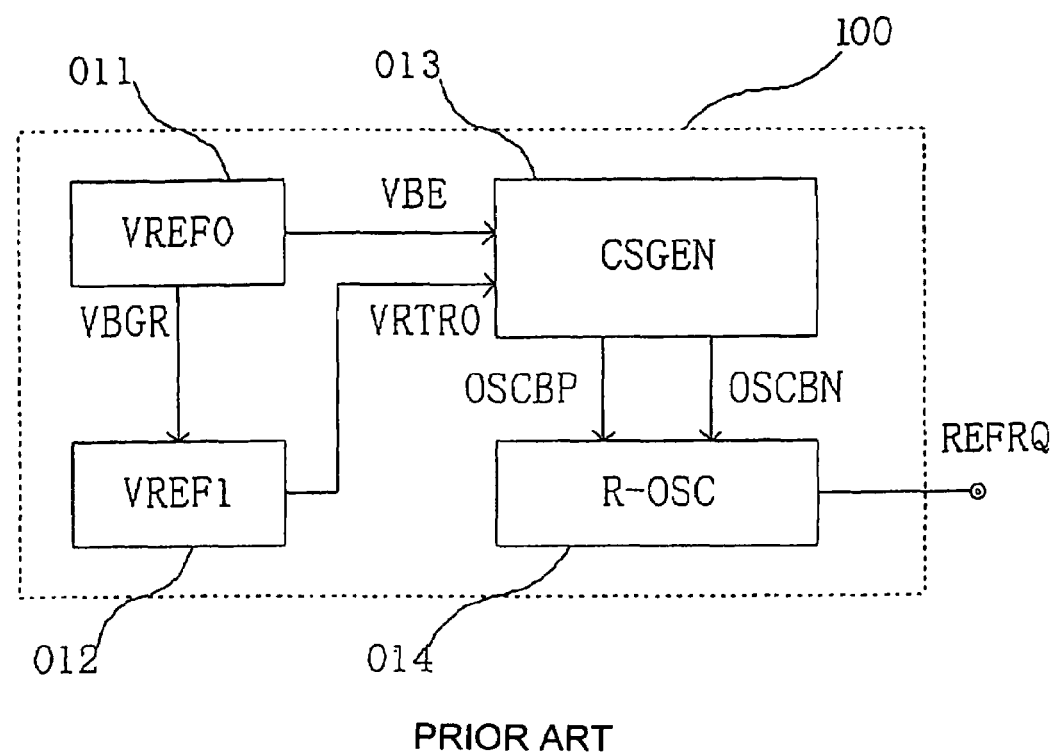
FIG. 9 is a diagram illustrating a configuration example of a conventional analog-system refresh period generating circuit.
Figure 10:
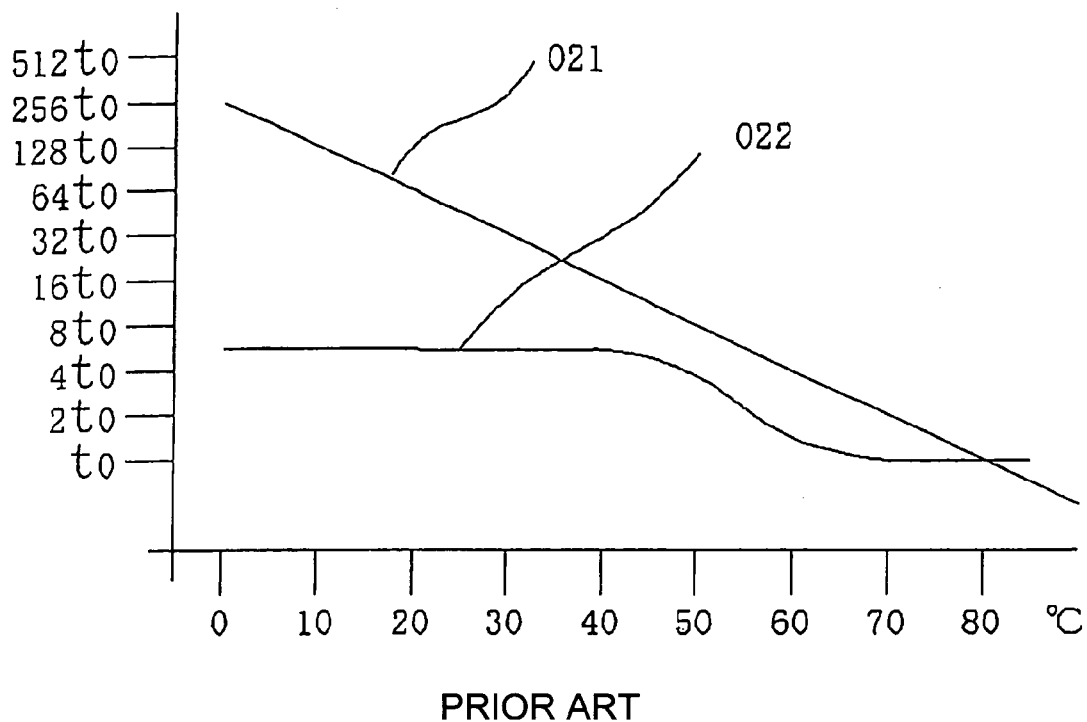
FIG. 10 is a graph showing a relationship between temperature and refresh period in the conventional analog-system refresh period generating circuit as shown in FIG. 9.
Figure 11:
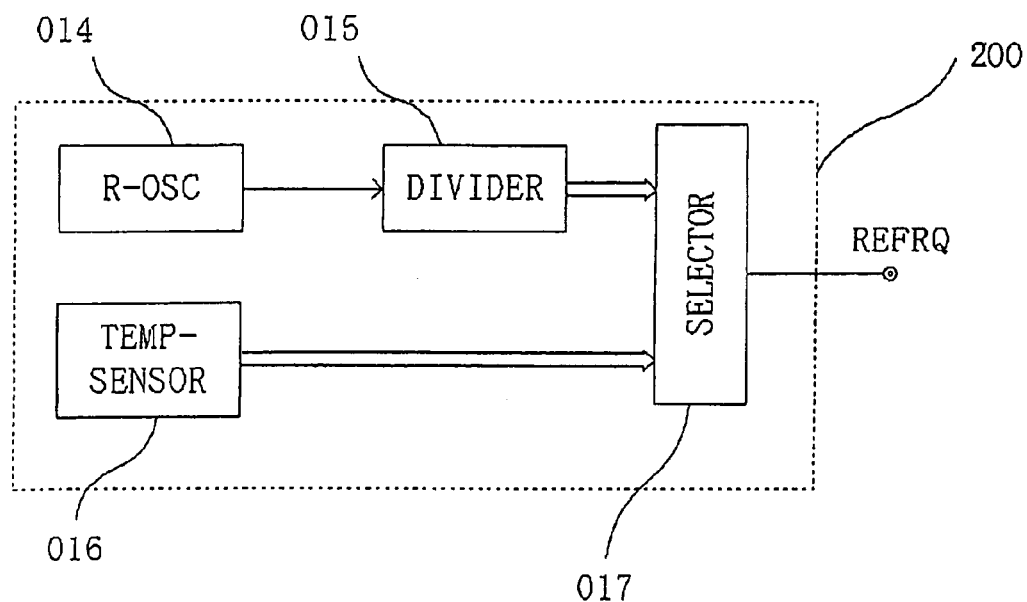
FIG. 11 is a diagram illustrating a configuration example of a conventional digital-system refresh period generating circuit.
Figure 12:
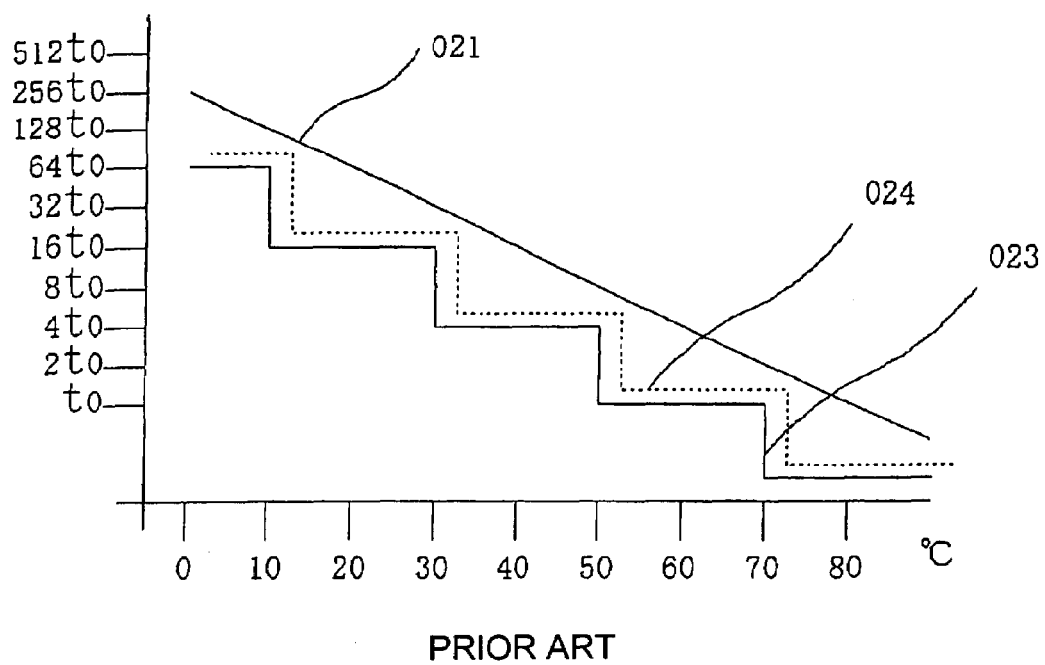
FIG. 12 is a graph illustrating a relationship between temperature and refresh period in the conventional digital-system refresh period generating circuit as shown in FIG. 11.

The analog oscillation circuit 002 basically has the same configuration as in FIG. 9, and is comprised of a band-gap type reference voltage generating circuit (VREF0) 011, a comparative voltage generating circuit (VREF1) 012, a current control signal generating circuit (CSGEN) 013 with positive temperature dependence, and a ring oscillator (R-OSC) 014 as an oscillator.

In the analog oscillation circuit 002, the band-gap type reference voltage generating circuit 011 outputs voltage VBGR with no temperature dependence and voltage VBE with temperature dependence. The comparative voltage generating circuit 012 receives as its input the voltage VBGR, and based on the voltage VBGR, generates comparative voltage VRTR0 with no temperature dependence suitable for comparison. The current control signal generating circuit 013 receives the voltage VBE and comparative voltage VRTR0 to compare, generates current control signals OSCBP and OSCBN, and inputs both the signals to the ring oscillator 014. The ring oscillator 014 is configured to control the oscillating frequency using the current control signals OSCBP and OSCBN and output an oscillation output OSCOUT.

Figure 2:
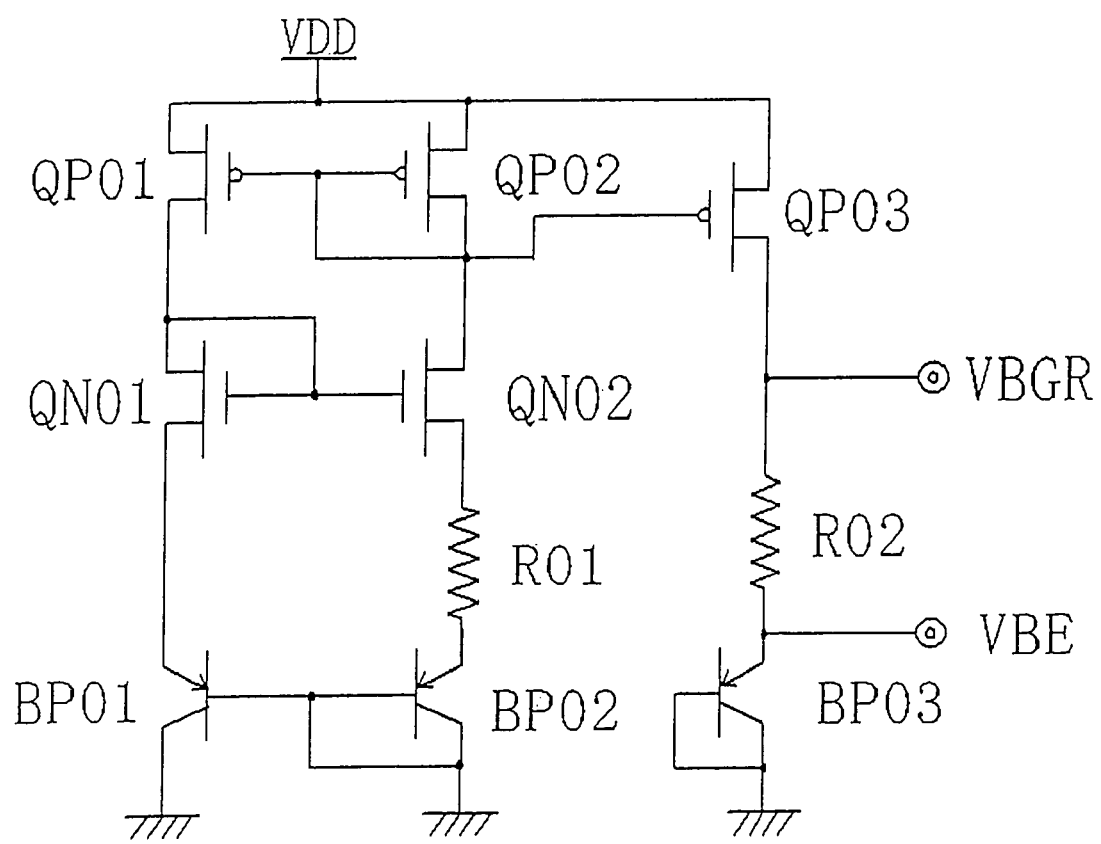
FIG. 2 is a diagram illustrating a configuration example of a band-gap type reference voltage generating circuit included in an analog oscillation circuit.

FIG. 2 shows a configuration example of the band-gap type reference voltage generating circuit 011. The band-gap type reference voltage generating circuit 011 as shown in FIG. 2 is comprised of P-channel transistors QP01, QP02 and QP03, N-channel transistors QN01 and QN02, bipolar transistors BP01, BP02 and BP03, and resistors R01 and R02. It is possible to obtain the reference voltage VBGR with no temperature dependence by appropriately selecting a ratio between emitter areas of the bipolar transistors BP01 and BP02, and a ratio between resistors R01 and R02. Meanwhile, the voltage VBE corresponding to the voltage between the base and emitter of the bipolar transistor BP03 has a negative temperature coefficient, and has the temperature dependence such that the voltage decreases as the temperature increases.

Figure 3:
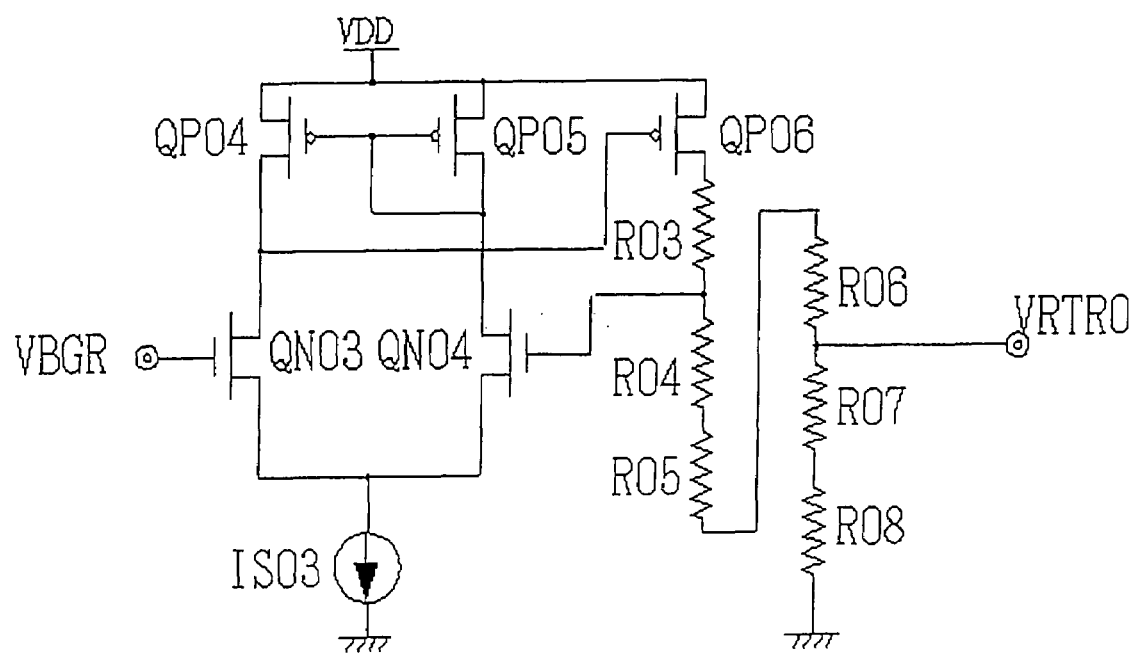
FIG. 3 is a diagram illustrating a configuration example of a comparative voltage generating circuit included in the analog oscillation circuit.

FIG. 3 shows a configuration example of the comparative voltage generating circuit 012. The comparative voltage generating circuit 012 as shown in FIG. 3 is comprised of P-channel transistors QP04, QP05 and QP06, N-channel transistors QN03 and QN04, current source IS03, and resistors R03 to R08. The comparative voltage generating circuit 012 is to generate the comparative voltage VRTR0 without any temperature dependence from the reference voltage VBGR without any temperature dependence. A plurality of resistors, R04 to R08, in series connection is provided to select a desired level of the comparative voltage VRTR0 from each connection point of resistors.

In FIG. 3, paired P-channel transistors QP04 and QP05, paired N-channel transistors QN03 and QN04 and current source IS03 integrally constitute a differential amplifier. The gates of current-mirror-connected P-channel transistors QP04 and QP05 are connected to the drain of the P-channel transistor QP05. The drain potential of the P-channel transistor QP04 is input to the gate of the P-channel transistor QP06, and by the series connection of the P-channel transistor QP06 and resistors R03 to R08, the voltage substantially equal to the reference voltage VBGR is generated at a connection point of resistors R03 and R04. The voltage is divided by resistors R04 to R08, while being compared with the reference voltage VBGR in the above-mentioned differential amplifier, thereby outputting desired comparative voltage VRTR0 with no temperature dependence.

When the gate potential of the N-channel transistor QN04 decreases that corresponds to the reference voltage VBGR input to the gate of the N-channel transistor QN03 of the differential amplifier, since the current decreases that flows through the P-channel transistor QP05 and N-channel transistor QN04, the gate potential of common connection of the P-channel transistors QP04 and QP05 in current mirror connection increases relatively. As a result, the current flowing through the P-channel transistors QP04 and QP05 decreases, and there decreases the drain potential of the N-channel transistor QN03, i.e. the gate potential of the P-channel transistor QP06. Therefore, the P-channel transistor QP06 is on more strongly, and the current flowing through this transistor is increased. Accordingly, the potential increases at the drain of the P-channel transistor QP06 and each connection point divided by resistors R03 to R08. In other words, the feedback mechanism acts that increases an input (the gate potential of the N-channel transistor QN04) of the differential amplifier. Therefore, it is understood that by voltage division using the resistors R03 to R08, it is possible to obtain the desired comparative voltage VRTR0 with no temperature dependence.

Figure 4:
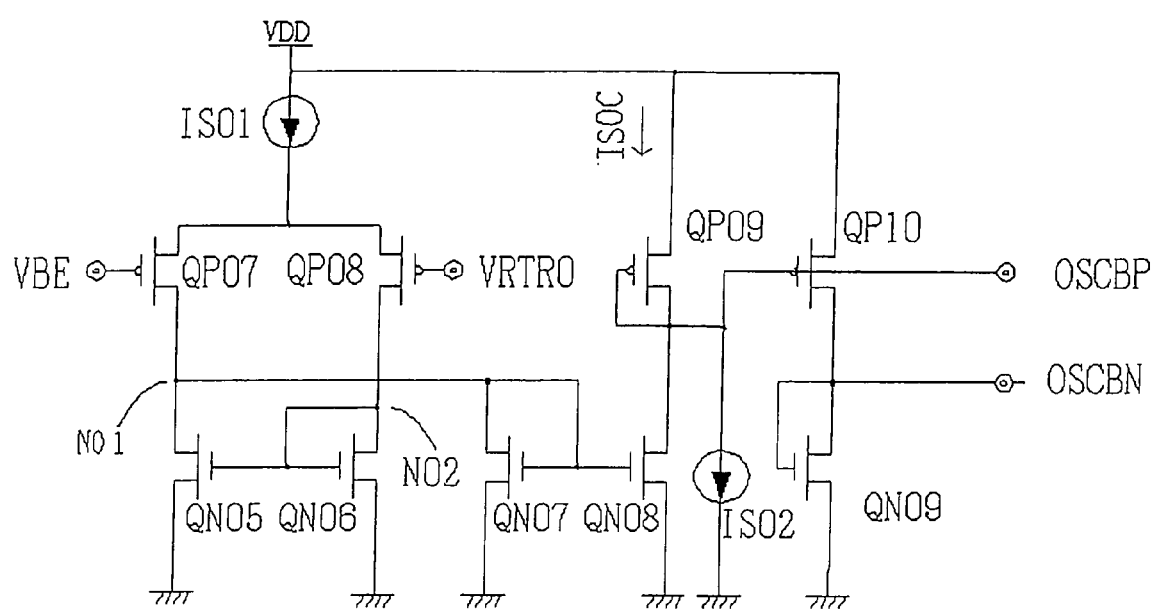
FIG. 4 is a diagram illustrating a configuration example of a current control signal generating circuit included in the analog oscillation circuit.

FIG. 4 shows a configuration example of the current control signal generating circuit 013 with positive temperature dependence. The current control signal generating circuit 013 as shown in FIG. 4 is comprised of P-channel transistors QP07 to QP10, N-channel transistors QN05 to QN09, and current sources IS01 and IS02. The current source IS01, P-channel transistors QP07 and QP08 receiving the reference voltage VBE and comparative voltage VRTR0 to compare, and current-mirror-connected N-channel transistors QN05 and QN06 integrally constitute a differential amplifier. An output of the differential amplifier is supplied to the gate and drain of the N-channel transistor QN07 as a MOS diode connected in parallel with the N-channel transistor QN05.

The diode-coupled P-channel transistor QP09 and the N-channel transistor QN08 to which the output of the differential amplifier in FIG. 4 is supplied as the gate potential are disposed in series between the power supply and ground potential, while the constant current source IS02 is disposed in parallel with the N-channel transistor QN08. The gate/drain potential of the P-channel transistor QP09 is output as a current control signal OSCBP. Further, the P-channel transistor QP10 using the current control signal OSCBP as a gate input and N-channel transistor QN09 as a MOS diode are disposed in series between the power supply and ground potential. The gate/drain potential of the N-channel transistor QN09 is output as a current control signal OSCBN. As the constant current source IS02, an extremely-small-size N-channel transistor biased at high gate voltage may be used, described later. It is set that even when the N-channel transistor QN08 is cut off, current control signals OSCBP and OSCBN output from the current control signal generating circuit 013 always maintain a level that turns on a P-channel or N-channel transistor.

Figure 5:
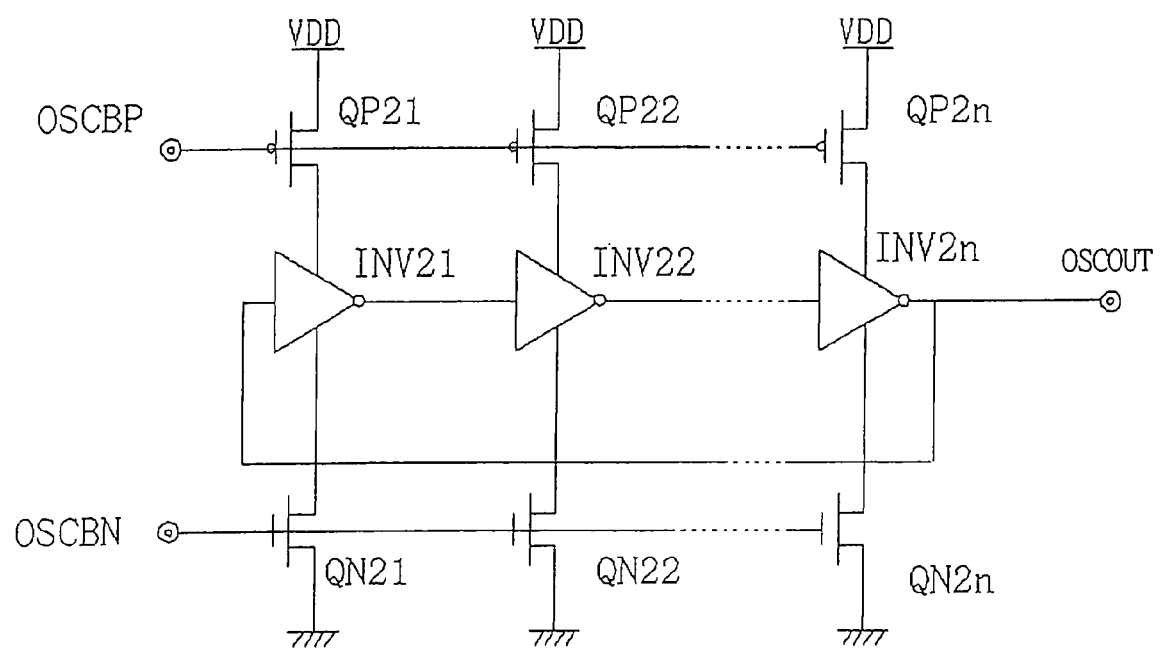
FIG. 5 is a diagram illustrating a configuration example of a ring oscillator included in the analog oscillation circuit.

FIG. 5 shows a configuration example of the ring oscillator 014. The ring oscillator 014 as shown in FIG. 5 is comprised of P-channel transistors QP21 to QP2n, N-channel transistors QN21 to QN2n and inverters INV21 to INV2n, where n is an odd number of three or more. The reason why n is an odd number is that an odd number of inverters are required to obtain successive oscillation in a configuration of an oscillator connected in the form of a ring. In addition, hereinafter, any of first to nth inverters or transistors is represented with i.

The current control signal OSCBP output from the current control signal generating circuit 013 is input to the gate of the P-channel transistor QP2i, and the similarly output current control signal OSCBN is input to the gate of the N-channel transistor QN2i. P-channel transistors QP2i, N-channel transistors QN2i, and inverters INV2i between the power supply and ground, connected in the form of an odd-number-stage ring, constitute an oscillator (ring oscillator). It is desired that the size ratio between the P-channel transistor QP2i and N-channel transistor QN2i is equal to the size ratio between the transistors QP10 and QN09 in the current control signal generating circuit 013, and that the transistors QP2i and QN2i are sufficiently smaller than the transistor of the inverter INV2i. In such a case, the charge/discharge capability of the inverter INV2i is determined by the current levels of transistors QP2i and QN2i, i.e. the potentials of the current control signals OSCBP and OSCBN. The oscillation period of the ring oscillator 014 is proportional to signal propagation time tpd of the inverter INV2i constituting the oscillator, and it is understood that the oscillating frequency of the ring oscillator 014 is controlled by the levels of the current control signals OSCBP and OSCBN output from the current control signal generating circuit 013.

The qualitative temperature dependence of the current control signals OSCBP and OSCBN will be described below with reference to FIG. 4. In the differential amplifier having the voltage VBE and comparative voltage VRTR0 as its inputs, the comparative voltage VRTR0 is supplied from the comparative voltage generating circuit 012 not to have the temperature dependence, i.e. to keep the constant voltage even when the temperature varies. Meanwhile, as is well known, the voltage VBE has negative temperature dependence. Accordingly, as the temperature increases, the voltage VBE decreases, the current increases in the P-channel transistor QP07, and therefore, a comparative-signal-side output N01 becomes high, while a reference-voltage-side output N02 becomes low. On the other hand, as the temperature decrease, the voltage VBE increases, the current decreases in the P-channel transistor QP07, and therefore, the comparative-signal-side output N01 becomes low, while the reference-voltage-side output N02 becomes high. As a result, in the N-channel transistors QN07 and QN08 of which the gates are biased by the comparative-signal-side output, a larger amount of current flows as the temperature is higher, while a smaller amount of current flows as the temperature is lower.

Accordingly, the ring oscillator control current ISOC flowing in the P-channel transistor QP09 decreases as the temperature is lower. Then, when the comparative-signal-side output N01 is equal to or less than threshold Vthn of the N-channel transistor, the current becomes zero in the N-channel transistor QN07 as a load transistor, while the current in the N-channel transistor QN08 becomes zero also. Accordingly, the ring oscillator control current ISOC flowing in the transistor QP09 becomes the minimum (ISOCmin), and is only of the current I02 flowing in the constant current source IS02 (ISOCmin=I02). In order to obtain stable oscillation, it is necessary to keep the current I02 flowing in the constant current source IS02 at about 1 μA.

Considered next is the maximum value (ISOCmax) of the ring oscillator control current ISOC flowing in the P-channel transistor QP09. In the differential amplifier driven by the current source IS01 in FIG. 4, when the voltage VBE is low, the comparative voltage VRTR0 is high and the current flowing in the P-channel transistor QP08 is low as possible, the current I01 almost equal to the current source IS01 flows in the N-channel transistor QN07 via the P-channel transistor QP07. IF the N-channels QN07 and QN08 are equal in size ratio, the maximum value of the current flowing in the P-channel transistor QP09 is the sum (I01+I02) of the currents flowing in the current sources IS01 and IS02.

The above-mentioned current I01 is set relatively freely. The amplitude range of the current control signal OSCBP or OSCBN is preferably set at within one-half VDD, in consideration of the symmetric property of levels of currents flowing in a group of transistors for current control to connect the current control signals OSCBP and OSCBN in FIG. 5, or the like. Further, considering reduction in entire current consumption, it is preferable to set at a few times the current I02. Accordingly, if the current I01 is set at five times the current I02, the maximum value (ISOCmax) of the ring oscillator control current ISOC is 6I02, and about 0.6 μA. In addition, the current is to flow through part of the circuit of FIG. 4, and actually, current flows in each block included in the refresh period generating circuit 001.

Specific examples of other set values such as potential are as described below. As one example, the voltage VBE is set at about 0.7V at room temperature (25° C.), and varies by about 0.4V at temperatures from 0° C. to 70° C. (about −0.15V/25° C.). Further, depending on a design value showing at what temperature the frequency of the ring oscillator 014 is varied at the maximum, as one example, the comparative voltage VRTR0 is set at about 0.5V. The value of 0.5V corresponds to the value of the voltage VBE at a temperature of about 60° C. Accordingly, in an ambient temperature range from 0° C. to 70° C., when the voltage VBE becomes the minimum voltage (assumed as about 0.4V at 70° C.), the current flowing in the P-channel transistor QP09 becomes the maximum, as described previously.

As described above, the oscillating frequency of the ring oscillator 014 is controlled by the current control signals OSCBP and OSCBN output from the current control signal generating circuit 013. Then, as the temperature becomes higher, the current control signal OSCBP decreases, while the current control signal OSCBN increases, and therefore, the ring oscillator control current ISOC increases. As a result, the oscillating frequency of the ring oscillator 014 increases. Meanwhile, as the temperature becomes lower, the current control signal OSCBP increases, while the current control signal OSCBN decreases, and therefore, the ring oscillator control current ISOC decreases. As a result, the oscillating frequency of the ring oscillator 014 decreases. In this way, the frequency ratio between low temperature and high temperature of the oscillating frequency of the ring oscillator 014 is determined by ISOCmax/ISOCmin.

In FIG. 1, the oscillation output OSCOUT output from the analog oscillation circuit 002 is input to the dividing circuit 015. Based on the oscillation output OSCOUT, the dividing circuit 015 outputs signals of a plurality of divided frequencies. The divided frequencies are substantially represented by $2^m$ times (m is defined as an integer including negative value). Based on a signal of the temperature sensor 016, the frequency selector 017 outputs the refresh reference signal REFRQ corresponding to one of the plurality of frequencies. In addition, the refresh reference signal REFRQ is a signal as a reference of a signal (REF signal) to instruct refresh of the DRAM cells. The REF signal may be generated by multiplying the refresh reference signal REFRQ by k (k is a positive integer) using a counter or the like, or the refresh reference signal REFRQ may be used as the REF signal without modification.

Figure 6:
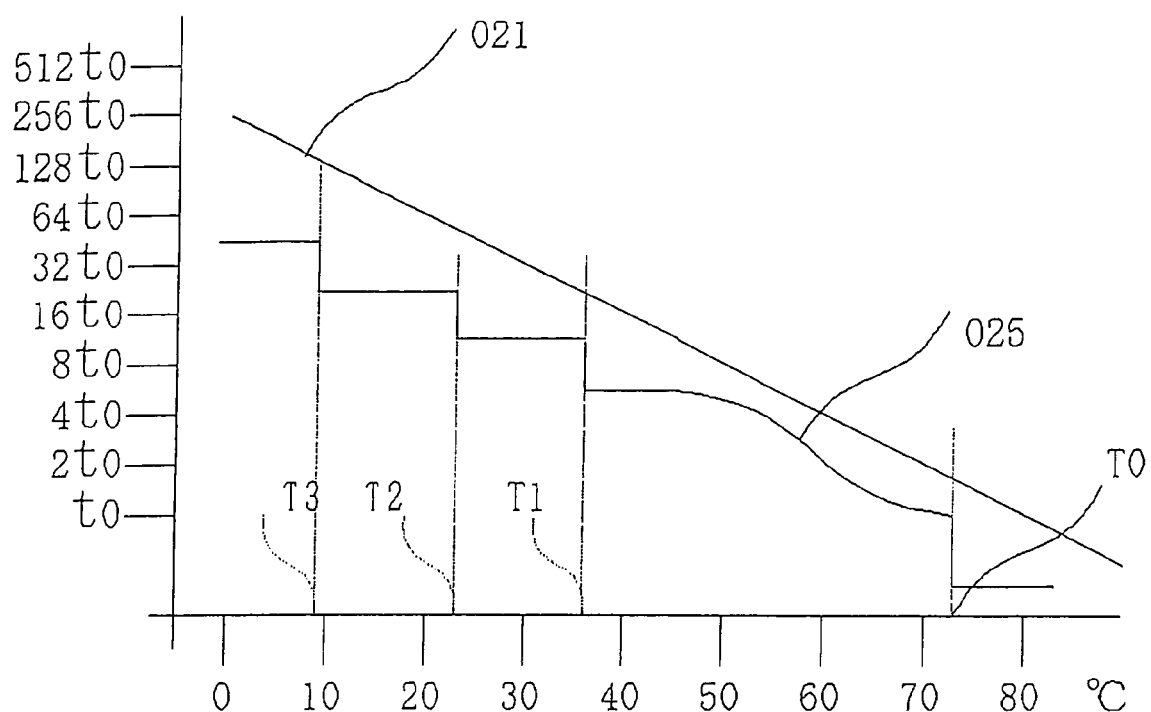
FIG. 6 is a graph illustrating a first relationship between temperature and refresh period in the refresh period generating circuit of this embodiment.

FIG. 6 shows the first relationship between temperature and refresh period in the refresh period generating circuit 001 of this embodiment. In the graph, the horizontal axis represents temperature, while the vertical axis represents normalized refresh period. t0 indicates normalized one period of refresh on the vertical axis in the graph, and the vertical axis represents a logarithmic axis such that the value becomes two times as one period t0 increases by one scale. In FIG. 6, a line 021 shows the temperature dependence of data retention characteristics (refresh period required for holding data) of the DRAM cell, and a curve 025 shows the first temperature dependence of the refresh period in the refresh period generating circuit 001. The temperature sensor 016 detects temperature T0 at which the temperature dependency of the frequency becomes saturated in a region of high temperatures. Then, when the temperature is T0 or more, the frequency selector 017 selects one of divided signals by smaller numbers (such that the period is short and the frequency is high) in the dividing circuit 017 and generates the refresh reference signal REFRQ. By executing refresh using the generated refresh reference signal REFRQ, it is possible to support decreases in data retention time.

Meanwhile, the temperature sensor 016 detects temperature T1 around a point at which the temperature dependence becomes saturated in a region of low temperatures. When the temperature is in a range of T0 to T1, the period is varied in analog form according to the temperature dependence of the period in the oscillation output OSCOUT of the oscillation circuit 002. In addition, the actual period may be set some times that of the ring oscillator 014 in response to the division output of the dividing circuit 015. When the temperature is lower than T1, the frequency selector 017 selects a long period, thereby implementing refresh with low current. Values of detection temperatures T0 and T1 of temperature dependence saturation point and the multiple of period switching are set suitably according to selection of the design. Further, the temperature sensor 016 detects temperatures T2 and T3 in a region lower than temperature T1 to make the refresh period longer with decrease in temperature, whereby it is possible to realize low power consumption.

In addition, in order for the frequency selector 017 to obtain a lower frequency in selecting the frequency, another low-frequency oscillator may be provided to divide and select a signal thereof as a substitute for the ring oscillator 014. Further, the operation of the ring oscillator 014 may be halted at that time.

Figure 7:
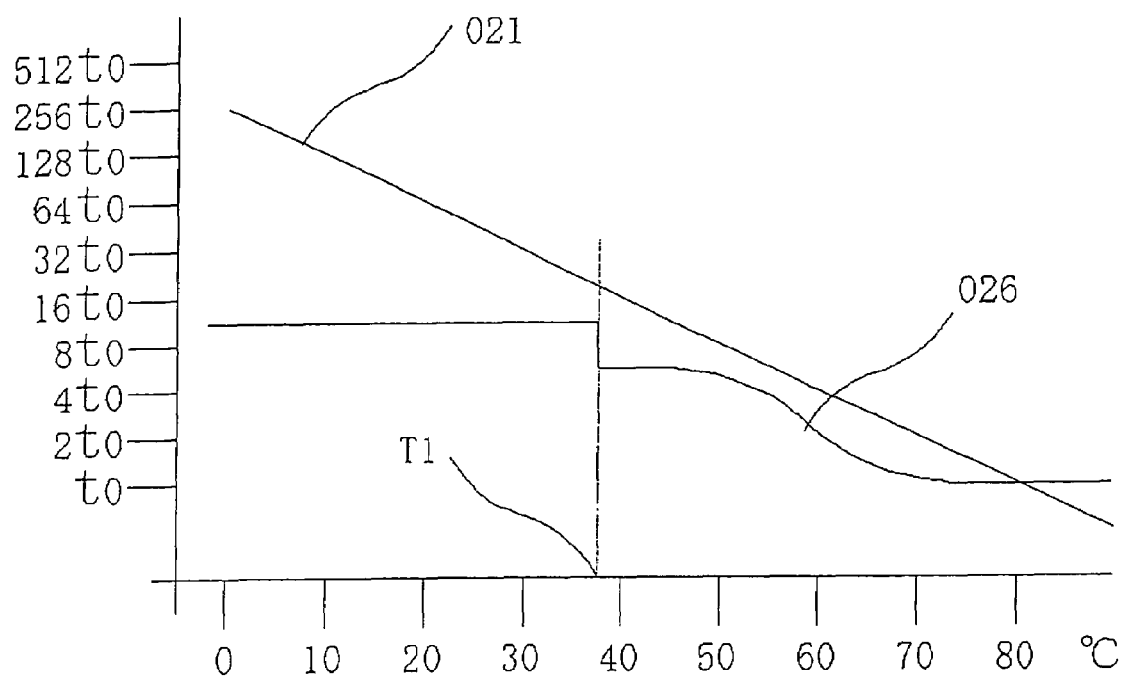
FIG. 7 is a graph illustrating a second relationship between temperature and refresh period in the refresh period generating circuit of this embodiment.

FIG. 7 is a graph illustrating the second relationship between temperature and refresh period in the refresh period generating circuit 100 of this embodiment. In addition, the horizontal axis and vertical axis of the graph represent the same as in FIG. 6. In FIG. 7, a line 021 shows the temperature dependence of data retention characteristics of the DRAM cell, and a curve 026 shows the second temperature dependence of the refresh period in the refresh period generating circuit 001. As shown in FIG. 7, in a low temperature region where the positive temperature dependence of the frequency disappears in the analog oscillation circuit 002, the temperature sensor 016 detects temperature T1. Then, the frequency selector 017 selects one of signals divided in the dividing circuit 015, and generates the refresh reference signal REFRQ.

Meanwhile, particularly in a high temperature region, for example, at ambient temperatures from 40° C. to 70° C., the refresh reference signal REFRQ is generated by using the output of the analog oscillation circuit 002 without modification. In an example of FIG. 7, the temperature to operate the analog oscillation circuit 002 is set at a high temperature, while the signal is divided when necessary to reduce the entire current consumption in a stationary state with no temperature dependence in a region of low temperatures. Thus, in the second temperature dependence of this embodiment, the curve 026 showing the temperature dependence of the refresh period in the refresh period generating circuit 001 is designed to have necessary and sufficient margins in a region of high temperatures, the number of division outputs in the dividing circuit 015 can thereby be decreased, and an advantage is provided such that temperature detection points can be reduced in the temperature sensor 016, in addition to reduction in power consumption.

Figure 8:
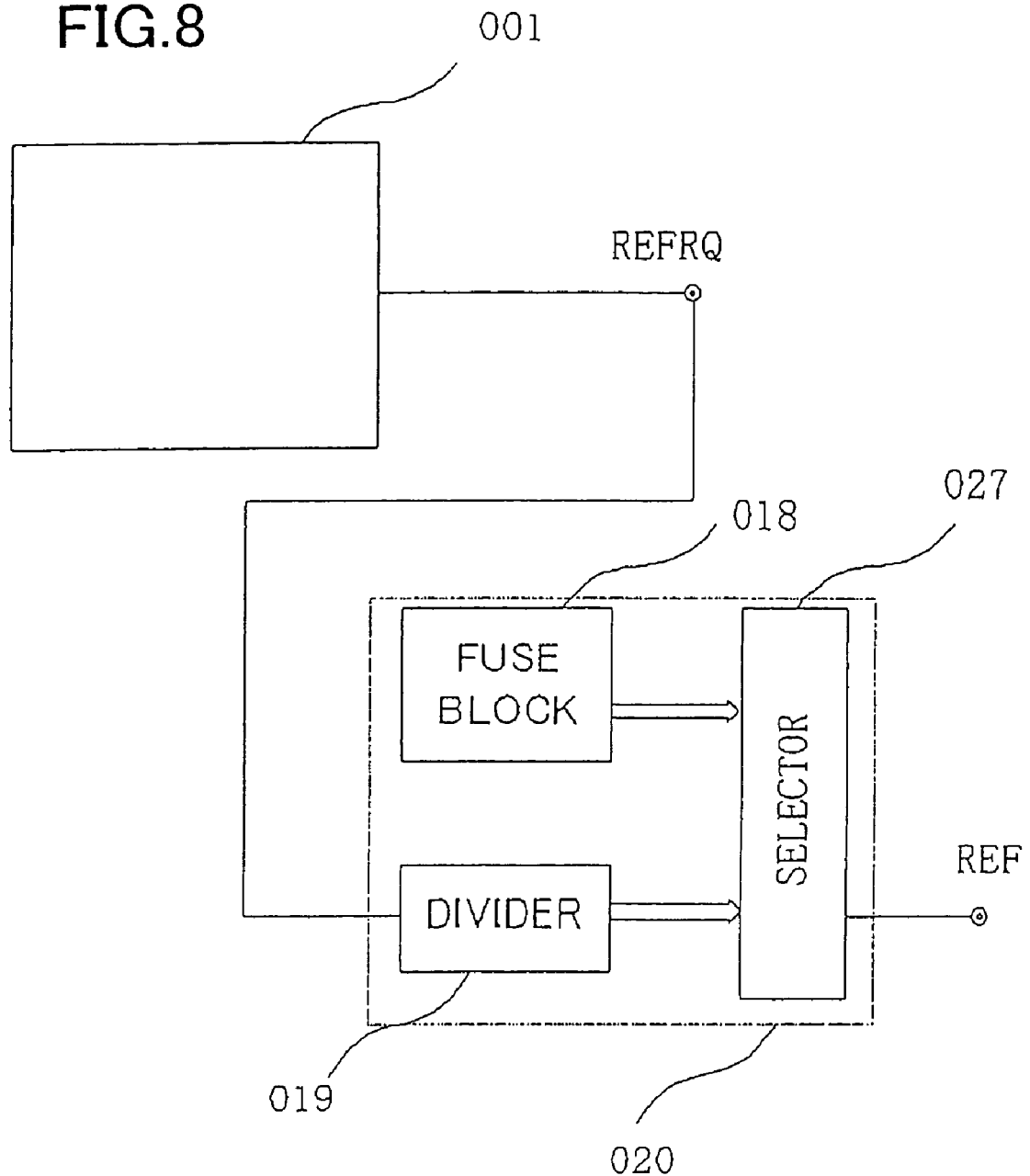
FIG. 8 is a diagram illustrating a configuration example of this embodiment suitable for DRAM products;.

FIG. 8 shows a configuration example of this embodiment particularly suitable for DRAM products requiring reduced power consumption in refresh. In general DRAM products, since data retention characteristics of the DRAM cell originally fluctuate greatly, such a technique is used that the capability of data retention characteristics of the DRAM cell is tested in manufacturing the product, and a refresh period suitable for the capability is set. FIG. 8 that is one example of such a technique shows a refresh period adjusting circuit 020 corresponding to the data retention characteristics of the DRAM cell, in addition to the refresh period generating circuit 001 of this embodiment. The refresh period adjusting circuit 020 includes a fuse block 018, second divider 019, and second frequency selector 027. In such a configuration, the refresh period generating circuit 001 outputs the refresh reference signal REFRQ to the second divider 019, and the second frequency selector 027 outputs the refresh signal REF to the DRAM cell.

In FIG. 8, the setting of a refresh period suitable for a DRAM product is performed by beforehand measuring data retention time of the DRAM cell and a frequency of the refresh signal REF selected without disconnection of the fuse (or a period of the refresh signal without disconnection of the fuse), and using the result, disconnecting the fuse in response to the required refresh period. As described above, according to the status of disconnection of the fuse in the fuse block 018, the refresh period adjusting circuit 020 selects an optimal refresh period that the DRAM cell of the DRAM product needs in the second selector 027, and outputs the refresh signal REF.

Thus, by adjusting the refresh period at high temperatures using the technique as shown in FIG. 8 as well as the constitution of this embodiment, as in the graph shown in FIG. 7, it is possible to adapt specifications of data retention characteristics in a high temperature region suitably. In addition thereto, since the standby current flowing in a DC manner accounts for a large percentage in a low temperature region, it is possible to keep power consumption under a target value in performing refresh at regular intervals relatively in the standby state, without determining a period very precisely to reduce current consumption of refresh in a low temperature region. In addition, the refresh period adjusting circuit 020 as shown in FIG. 8 may be provided between the ring oscillator 014 and dividing circuit 015, as well as being provided after the refresh period generating circuit 001.

As described previously, the standby current flowing in a DC manner at regular intervals in the low temperature region flows through, for example, the current sources IS01 and IS02, ring oscillator control current ISOC, band-gap type reference voltage generating circuit 011, ring oscillator 014 and the like in the analog oscillation circuit 002. In particular, in a temperature region where the temperature dependence of the oscillation period becomes saturated, it is not necessary to use the analog oscillation circuit 002 with large power consumption and positive temperature dependence of the frequency. Accordingly, it is also possible to halt the operation of the analog oscillation circuit 002 (make the power consumption zero) to switch to another oscillator with less power consumption.

Further, in the analog oscillation circuit 002, at the temperature where the voltage VBE and comparative voltage VRTR0 become equal which are input to the current control signal generating circuit 013 as shown in FIG. 4, an inflection point appears in variation in oscillating frequency with temperature. As the temperature becomes higher or lower than such a temperature, the frequency gradually approaches a constant value without variations with temperature. By adjusting the amplification rate of the differential amplifier in the configuration of FIG. 4, it is possible to vary a coefficient of the temperature gradient of the above-mentioned oscillating frequency. Accordingly, it is possible to vary a predetermined temperature range where the frequency has a positive temperature coefficient, by varying the circuit configuration or dimensions of transistors. Herein, the predetermined temperature range provided with the positive temperature coefficient is defined as described below.

In the current control signal generating circuit 013 in FIG. 4 and ring oscillator 014 in FIG. 5, the ring oscillator 014 operates at the maximum frequency Fmax in the case where a value of the comparative-signal-side output N01 has a maximum value in the differential amplifier in FIG. 4. In other words, such a case is that almost all the current flowing in the current source IS01 flows via the P-channel transistor QP07 and N-channel transistor QN07. When the comparative-signal-side output N01 has the maximum value and is determined specifically, the current control signals OSCBP and OSCBN are determined uniquely.

Further, the ring oscillator 014 operates at the minimum frequency Fmin in the case where the comparative-signal-side output N01 has a minimum value in the differential amplifier in FIG. 4. In other words, when almost all the current flowing in the current source IS01 flows via the P-channel transistor QP08 and N-channel transistor QN06, such a case is that the comparative-signal-side output N01 is close to the ground level and N-channel transistors QN07 and QN08 are cut off. In this case, since the N-channel transistor QN08 is cut off, the current control signals OSCBP and OSCBN are determined uniquely by the P-channel transistor QP09 and the value of the constant current source IS02.

Herein, assuming that the analog oscillation circuit 002 has positive temperature dependence and that the minimum frequency Fmin is f0, the maximum frequency Fmax is almost a few times (for example, assuming as six times) the Fmin. That is, the relationship of Fmax=6×(Fmin)=6×(f0) is satisfied. Accordingly, in the graph illustrating the relationship between temperature and refresh period in FIG. 6 or 7, the frequency (period in the figure) varies by six times, and therefore, (Log6-Log1) is an entire variation range with respect to the vertical logarithmic axis. As results of tests on the variation range of the frequency (period in the graph) on the logarithmic axis, excellent characteristics were obtained when 85% to 90% or more of such a range was set as a region of the high temperatures out of the predetermined temperature range, while 15% to 10% or less of such a range was set as a region of the low temperatures out of the predetermined range.

In the variation range of the frequency (period in the figure) on the logarithmic axis, a case is considered that more than 85% of such a range is set as the region of the high temperatures out of the predetermined temperature range, while less than 15% of such a range is set as the region of the low temperatures out of the predetermined range. At this point, in the refresh period generating circuit 001, the region of the high temperatures is regarded as an oscillation range of 77% or more of the maximum oscillating frequency. 77% of the maximum oscillating frequency is calculated by dividing $10^{Log1}$ by $10^{0.15 \times (Log6-Log1)}$. Further, the region of the low temperatures out of the predetermined temperature range is regarded as an oscillation range of 130% or less of the minimum oscillating frequency. 130% of the minimum oscillating frequency is calculated by dividing $10^{(Log6-Log1)}$ by $10^{0.85 \times (Log6-Log1)}$.

Further, in the variation range of the frequency (period in the figure) on the logarithmic axis, a case is considered that more than 90% of such a range is set as the region of the high temperatures out of the predetermined temperature range, while less than 10% of such a range is set as the region of the low temperatures out of the predetermined range. At this point, in the refresh period generating circuit 001, the region of the high temperatures is regarded as an oscillation range of 84% or more of the maximum oscillating frequency. 84% of the maximum oscillating frequency is calculated by dividing $10^{Log1}$ by $10^{0.01 \times (Log6-Log1)}$. Furthermore, the region of the low temperatures out of the predetermined temperature range is regarded as an oscillation range of 119% or less of the minimum oscillating frequency. 119% of the minimum oscillating frequency is calculated by dividing $10^{(Log6-Log1)}$ by $10^{0.90 \times (Log6-Log1)}$.

As described above, according to the present invention, the refresh period is provided with analog-form temperature dependence in a temperature range (T0 to T1) where the temperature dependence of the refresh period is severe, and the temperature near the saturation temperature at high temperatures in the analog oscillation circuit 002 is set at about upper limit of the reliable operation temperature of the DRAM product. From the viewpoint of reliability of the data retention operation of the DRAM cell, the refresh period is switched to a shorter period at higher temperatures (the frequency selector 017 selects a shorter period divided in the dividing circuit 015, or may multiply the frequency in some cases). Meanwhile, at low temperatures causing no analog-form temperature dependence, since the DRAM cell has relatively sufficient data retention time, it is possible to provide a large operation margin. Accordingly, by applying the present invention, stable operation is made possible even in the case of using a refresh period provided with digital-form temperature dependence having large fluctuations.

What is claimed is:

1. A refresh period generating circuit which generates a refresh period in refreshing a DRAM cell, comprising:
    an oscillation circuit which oscillates at an oscillating frequency with temperature dependence on ambient temperature;
    a dividing circuit which divides an oscillation output of said oscillation circuit and outputs signals having a plurality of different frequencies;
    a temperature detector which detects said ambient temperature; and
    a selector which switches and selects among the signals of said dividing circuit based on an output of said temperature detector, and outputs a signal as a reference of said refresh period,
    wherein
    said oscillating frequency of said oscillation circuit has substantially said temperature dependence at least within a range from a first temperature point to a second temperature point lower than said first temperature point,
    and wherein said selector selects and outputs a signal of said dividing circuit having a frequency depending on said temperature dependence of analog form when said temperature detector detects a temperature within a range from said first temperature point to said second temperature point,
    selects and outputs one or more signals of said dividing circuit each having a frequency higher than said frequency depending on said temperature dependence of analog form when said temperature detector detects a temperature higher than said first temperature point, and
    selects and outputs one or more signals of said dividing circuit, each having a frequency lower than said frequency depending on said temperature dependence of analog form when said temperature detector detects a temperature lower than said second temperature point.

2. A refresh period generating circuit, which generates a refresh period in refreshing a DRAM cell, comprising:
    an oscillation circuit which oscillates at an oscillating frequency with temperature dependence on ambient temperature;
    a dividing circuit which divides an oscillation output of said oscillation circuit and outputs signals having a plurality of different frequencies;
    a temperature detector which detects said ambient temperature; and
    a selector which switches and selects among the signals of said dividing circuit based on an output of said temperature detector, and outputs a signal as a reference of said refresh period,
    wherein said oscillating frequency of said oscillation circuit has substantially said temperature dependence at least within a range from a first temperature point to a second temperature point lower than said first temperature point, and wherein in said selector, one or more switching temperature points are set, selection is performed such that a signal of higher temperature has a frequency higher than that of a signal of lower temperature at each switching temperature point, and all said switching temperature points are not included within a range from said first temperature point to said second temperature point.

3. A refresh period generating circuit according to claim 1 or 2, wherein a temperature range higher than said first temperature point is regarded as an oscillation range of 77% or more of a maximum oscillating frequency, and a temperature range lower than said temperature point is regarded as an oscillation range of 130% or less of a minimum oscillating frequency.

4. A refresh period generating circuit which generates a refresh period in refreshing a DRAM cell, comprising:

an oscillation circuit which oscillates at a frequency with temperature dependence on ambient temperature;

a dividing circuit which divides an oscillation output of said oscillation circuit and outputs signals having a plurality of different frequencies;

a temperature detector which detects said ambient temperature; and a selector which switches and selects among the signals of said dividing circuit based on an output of said temperature detector, and outputs a signal as a reference of said refresh period, wherein said temperature dependence in said oscillation circuit includes a positive temperature coefficient in a predetermined temperature range, and does not include a positive temperature coefficient out of said predetermined temperature range, wherein said selector switches said division outputs out of said predetermined temperature range, and wherein a region of high temperatures out of said predetermined temperature range is regarded as an oscillation range of 77% or more of a maximum oscillating frequency, and a region of low temperatures out of said predetermined temperature range is regarded as an oscillation range of 130% or less of a minimum oscillating frequency.

* * * * *